United States Patent
Huang et al.

(10) Patent No.: US 9,633,992 B1
(45) Date of Patent: Apr. 25, 2017

(54) ELECTROSTATIC DISCHARGE PROTECTION DEVICE

(71) Applicant: Vanguard International Semiconductor Corporation, Hsinchu (TW)

(72) Inventors: Yeh-Jen Huang, Hsinchu (TW); Yeh-Ning Jou, Hsinchu (TW); Geeng-Lih Lin, Zhudong Township (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/051,380

(22) Filed: Feb. 23, 2016

(51) Int. Cl.
*H01L 27/02* (2006.01)

(52) U.S. Cl.
CPC .................. *H01L 27/0262* (2013.01)

(58) Field of Classification Search
CPC ..................................... H01L 27/0262
USPC .......................................... 257/355
See application file for complete search history.

(56) References Cited

U.S. PATENT DOCUMENTS

| | | | | |
|---|---|---|---|---|
| 5,576,557 A * | 11/1996 | Ker | ..... | H01L 27/0259 257/141 |
| 7,542,253 B2 * | 6/2009 | Ker | ..... | H01L 27/0262 361/56 |
| 8,611,058 B2 * | 12/2013 | Fan | ..... | H01L 27/0617 361/118 |
| 8,823,128 B2 * | 9/2014 | Chan | ..... | H01L 21/8249 257/355 |
| 8,847,318 B2 * | 9/2014 | Lai | ..... | H01L 27/027 257/328 |
| 9,123,540 B2 * | 9/2015 | Salcedo | ..... | H01L 27/0262 |
| 2003/0122192 A1 * | 7/2003 | Ker | ..... | H01L 27/0262 257/347 |
| 2005/0045953 A1 * | 3/2005 | Ando | ..... | H01L 27/0928 257/355 |
| 2005/0121725 A1 * | 6/2005 | Ando | ..... | H01L 27/0266 257/356 |
| 2007/0246740 A1 * | 10/2007 | Yu | ..... | H01L 27/0262 257/173 |
| 2010/0187606 A1 * | 7/2010 | Kobayashi | ..... | H01L 21/823814 257/338 |

(Continued)

FOREIGN PATENT DOCUMENTS

TW    201143025 A1    12/2011

*Primary Examiner* — Ida M Soward
(74) *Attorney, Agent, or Firm* — Birch, Stewart, Kolasch & Birch, LLP

(57) ABSTRACT

An ESD protection device is provided. Each of a first and a second well has a first conductive type. Each of a first and a second doping region has a second conductive type and is formed in the first well. A third doping region has the first conductive type. A fourth doping region has the second conductive type. The third and fourth doping regions are formed in the second doping region. Each of a fifth and a sixth doping region has the second conductive type and is formed in the second well. A seventh doping region has the first conductive type. An eighth doping region has the second conductive type. The seventh and eighth doping region are formed in the sixth doping region. A first and a second trigger gate are formed on the first and second wells and partially cover the second and sixth doping regions respectively.

10 Claims, 4 Drawing Sheets

(56) References Cited

U.S. PATENT DOCUMENTS

| | | | | |
|---|---|---|---|---|
| 2013/0181288 A1* | 7/2013 | Shima | ............... | H01L 29/66681 257/336 |
| 2013/0187231 A1* | 7/2013 | Lai | ........................ | H01L 29/78 257/355 |
| 2013/0328125 A1* | 12/2013 | Ho | ..................... | H01L 27/0285 257/355 |
| 2015/0355664 A1* | 12/2015 | Mitsuishi | ................ | H03F 1/523 327/537 |

* cited by examiner

ELECTROSTATIC DISCHARGE PROTECTION DEVICE

BACKGROUND OF THE INVENTION

Field of the Invention

The invention relates to an electrostatic discharge protection device, and more particularly to an electrostatic discharge protection device with a silicon controlled rectifier.

Description of the Related Art

As semiconductor manufacturing processes have developed, electrostatic discharge (ESD) protection has become one of the most critical reliability issues for integrated circuits (IC). ESD protection circuits generally protect integrated circuits (IC) from machine model (MM) or human body model (HBM) electrostatic discharge events. Commercial integrated circuits require high tolerance to accidental ESD and the dangers this can cause. Otherwise, the IC can easily become damaged by an accidental ESD event. Therefore, designers always research how to design ESD protection elements to effectively protect ICs.

BRIEF SUMMARY OF THE INVENTION

In accordance with an embodiment, an electrostatic discharge protection device comprises a first well, a first doping region, a second doping region, a third doping region, a fourth doping region, a first trigger gate, a second well, a fifth doping region, a sixth doping region, a seventh doping region, an eighth doping region, and a second trigger gate. The first well has a first conductive type. The first doping region has a second conductive type and is formed in the first well. The second doping region has the second conductive type and is formed in the first well. The third doping region has the first conductive type and is formed in the second doping region. The fourth doping region has the second conductive type and is formed in the second doping region. The first trigger gate is formed on the first well and partially covers the second doping region. The second well has the first conductive type. The fifth doping region has the second conductive type and is formed in the second well. The sixth doping region has the second conductive type and is formed in the second well. The seventh doping region has the first conductive type and is formed in the sixth doping region. The eighth doping region has the second conductive type and is formed in the sixth doping region. The second trigger gate is formed on the second well and partially covers the sixth doping region.

A detailed description is given in the following embodiments with reference to the accompanying drawings.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
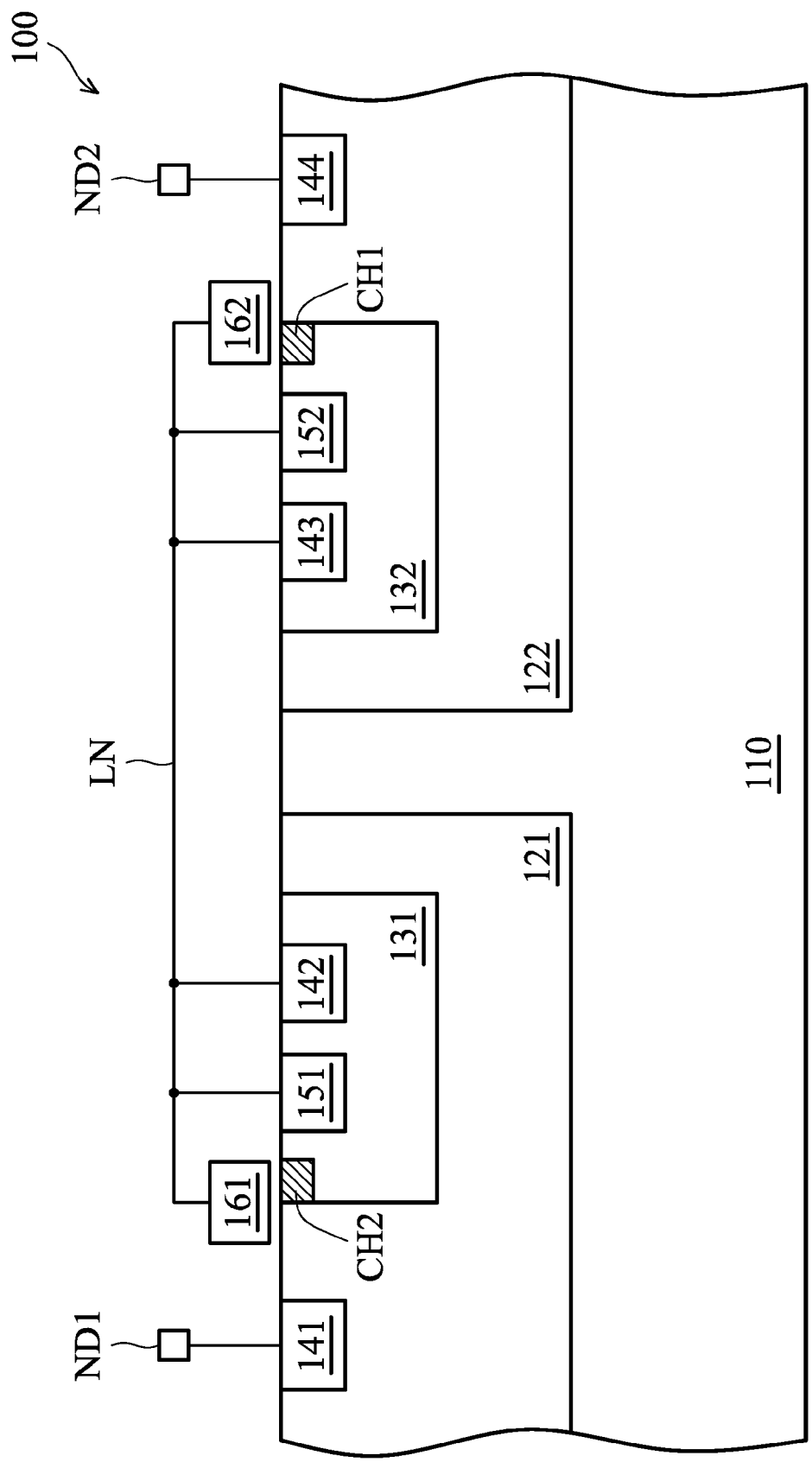
FIG. 1 is a schematic diagram of an exemplary embodiment of an ESD protection device, according to various aspects of the present disclosure.

FIG. 1 is a schematic diagram of an exemplary embodiment of an ESD protection device, according to various aspects of the present disclosure. As shown in FIG. 1, the ESD protection device 100 comprises a substrate 110, wells 121~122, doping regions 131~132, 141~144, and 151~152, and trigger gates 161~162. The doping regions 121~122 are lightly doped. In this embodiment, the well 121 is separated from the well 122 and does not contact the well 122. In one embodiment, a deep trench isolation technology is used to separate the wells 121 and 122. Each of the wells 121 and 122 has a first conductive type and formed in the substrate 110. The substrate 110 has a second conductive type. In one embodiment, the first conductive type is a N-type, and the second conductive type is a P-type. In another embodiment, the first conductive type is a P-type and the second conductive type is a N-type.

Each of the doping regions 131 and 141 has the second conductive type and formed in the first well 121. The impurity concentration of the doping region 131 is lower than the impurity concentration of the doping region 141. In one embodiment, when the second conductive type the the P-type, the doping region 131 is referred to as a P-body. However, when the second conductive type is the N-type, the doping region 131 is referred to as a N-body. In this embodiment, the doping region 141 is a heavily doped region.

The doping region 151 has the first conductive type and formed in the doping region 131. In one embodiment, the doping region 151 is a heavily doped region. The impurity concentration of the doping region 151 is higher than the impurity concentration of the well 121. The doping region 142 has the second conductive type and formed in the doping region 131. In one embodiment, the doping region 142 is a heavily doped region. The impurity concentration of the doping region 142 is similar to the impurity concentration of the doping region 141 and higher than the impurity concentration of the doping region 131. In this embodiment, the doping region 141, the well 121 and the doping regions 131 and 151 constitute a silicon controlled rectifier (SCR). Additionally, the doping region 141, the well 121 and the doping region 131 constitute a bipolar junction transistor (BJT).

Each of the doping regions 132 and 144 has the second conductive type and formed in the second well 122. The impurity concentration of the doping region 132 is lower than the impurity concentration of the doping region 144. The impurity concentration of the doping region 132 is similar to the impurity concentration of the doping region 131. In one embodiment, when the second conductive type is the P-type, the doping region 132 serves as a P-body. When the second conductive type is the N-type, the doping region 132 serves as a N-body. In this embodiment, the doping region 144 is a heavily doped region. The impurity concentration of the doping region 144 is similar to the impurity concentration of the doping region 141.

The doping region 152 has the first conductive type and formed in the doping region 132. In one embodiment, the doping region 152 is a heavily doped region. The impurity concentration of the doping region 152 is higher than the impurity concentration of the well 122. In another embodiment, the impurity concentration of the doping region 152 is similar to the impurity concentration of the doping region 151. The doping region 143 has the second conductive type and formed in the doping region 132. In one embodiment, the doping region 143 is a heavily doped region. The impurity concentration of the doping region 143 is similar to the impurity concentration of the doping region 141 and higher than the impurity concentration of the doping region 132. In this embodiment, the doping region 144, the well 122, the doping regions 132 and 152 constitute a SCR. Furthermore, the doping region 144, the well 122 and the doping region 132 constitute a BJT.

The trigger gate 161 is formed on the well 121 and partially covers the doping region 131. The trigger gate 162 is formed on the well 122 and partially covers the doping region 132. In this embodiment, the trigger gate 161, the doping regions 151, 142, 143, and 152 and the trigger gate 162 are electrically connected to each other via the connection line LN. The doping region 141 is electrically connected to the node ND1. The doping region 144 is electrically connected to the node ND2. When an ESD event occurs in the node ND1 and the node ND2 is coupled to ground, beginning at the node ND1, an ESD current flows through the first SCR constituted by the doping region 141, the well 121, the doping regions 131 and 151 and enters the doping region 143 through the connection line LN. Since the trigger gate 162 is coupled to the connection line LN, a channel CH1 is formed in the well 132. The ESD current entering into the doping region 143 flows to the well 122 through the doping region 132 and the channel CH1. Therefore, the voltage difference between the well 122 and the doping region 144 quick arrives to a turn-on level (e.g. 0.7V) such that the first BJT constituted by the doping region 132, the well 122 and the doping region 144 is triggered and turned on. Therefore, the ESD current quick flows through the doping regions 143, 132, the well 122 and the doping region 144 and finally to the node ND2.

Similarly, when an ESD event occurs in the node ND2 and the node ND1 is coupled to ground, beginning at the node ND2, an ESD current flows through the second SCR constituted by the doping region 144, the well 122, the doping regions 132 and 152 and enters the doping region 142 through the connection line LN. Since the trigger gate 161 is coupled to the connection line LN, a channel CH2 is formed in the well 131. The ESD current entering into the doping region 142 flows to the well 121 through the doping region 131 and the channel CH2. Therefore, the voltage difference between the well 121 and the doping region 141 quick arrives to a turn-on level (e.g. 0.7V) such that the second BJT constituted by the doping region 131, the well 121 and the doping region 141 is triggered and turned on. Therefore, the ESD current quick flows through the doping regions 142, 131, the well 121 and the doping region 141 and finally to the node ND1.

In one embodiment, when the first conductive type is the N-type and the second conductive type is the P-type, the first BJT constituted by the doping region 132, the well 122 and the doping region 144 is a pnp transistor. Similarly, the second BJT constituted by the doping region 131, the well 121 and the doping region 141 is a pnp transistor. Additionally, each of the wells 121 and 122 is a high voltage N-well (HVNW).

In another embodiment, when the first conductive type is the P-type and the second conductive type is the n-type, the first BJT constituted by the doping region 132, the well 122 and the doping region 144 is an npn transistor. Similarly, the second BJT constituted by the doping region 131, the well 121 and the doping region 141 is an npn transistor. Additionally, each of the wells 121 and 122 is a high voltage O-well (HVPW).

Figure 2:
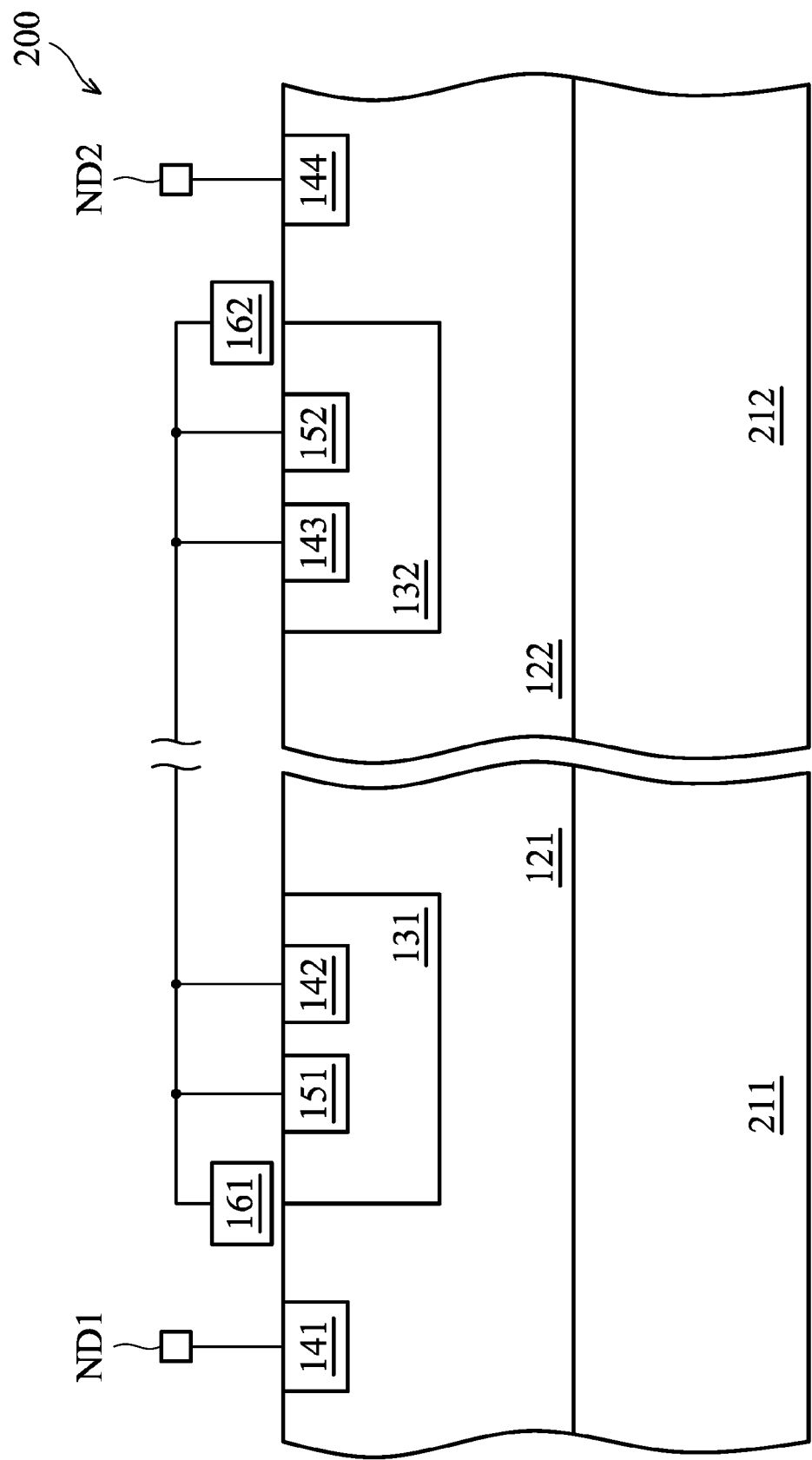
FIG. 2 is a schematic diagrams of another exemplary embodiments of the ESD protection device, according to various aspects of the present disclosure.

In this embodiment, the wells 121 and 122 are formed in the same substrate (e.g. 110), but the disclosure is not limited thereto. In other embodiments, the well 121 is formed in a substrate (e.g. 211) and the well 122 is formed in another substrate (e.g. 212) as shown in FIG. 2. In this case, the substrates 211 and 212 are separated and independent from each other. The substrate 211 does not contact the substrate 212.

Figure 3:
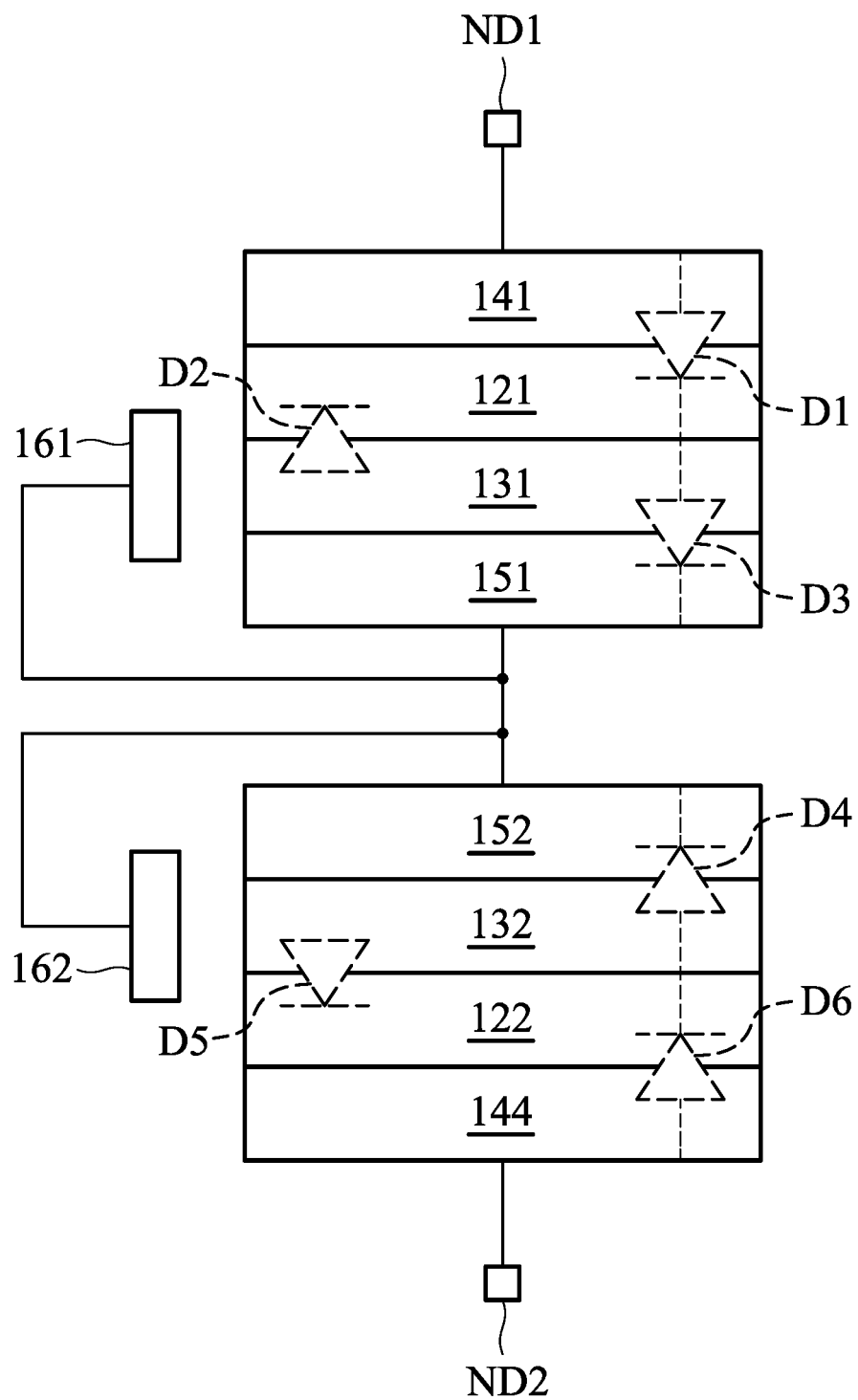
FIG. 3 is an equivalent circuit of the ESD protection device according to embodiments of the present invention.

FIG. 3 is an equivalent circuit of the ESD protection device 100 according to an embodiment of the present invention. For brevity, assume that the first conductive type is the N-type and the second conductive type is the P-type. As shown in FIG. 3, an equivalent diode D1 is formed between the doping region 141 and the well 121. Another equivalent diode D2 is formed between the doping region 131 and the well 121. Another equivalent diode D3 is formed between the doping regions 131 and 151. Another equivalent diode D4 is formed between the doping regions 132 and 152. Another equivalent diode D5 is formed between the doping region 132 and the well 122. Another equivalent diode D6 is formed between the doping region 144 and the well 122.

When an ESD event occurs in the node ND1 and the node ND2 is coupled to ground, the equivalent diodes D1 and D3 are turned on in a forward direction. Since the doping region 152 is electrically connected to the doping region 151, the voltage level of the doping region 152 increases. Therefore, the equivalent diode D4 is turned on in a reverse direction. Additionally, the voltage level of the trigger gate 162 is also increased. Therefore, the equivalent diode D5 is turned on in the forward direction. When the equivalent diode D5 is turned on, the voltage level of the well 122 is increased such that the equivalent diode D6 is turned on in the reverse direction. Since the equivalent diodes D1, D3, D4 and D6 are turned, the ESD current is released from the node ND1 to the node ND2. In this case, the doping region 141, the well 121, the doping regions 131 and 151 constitute a SCR. The SCR is serially connected to the pnp transistor constituted by the doping region 132, the well 122 and the doping region 144.

Similarly, when an ESD event occurs in the node ND2 and the node ND is coupled to ground, the equivalent diodes D4 and D6 are turned on in a forward direction. Since the doping region 152 is electrically connected to the doping region 151, the voltage level of the doping region 151 increases. Therefore, the equivalent diode D3 is turned on in a reverse direction. Additionally, the voltage level of the trigger gate 161 is also increased. Therefore, the equivalent diode D2 is turned on in the forward direction. When the equivalent diode D2 is turned on, the voltage level of the well 121 is increased such that the equivalent diode D1 is turned on in the reverse direction. Since the equivalent diodes D6, D4, D3 and D1 are turned, the ESD current is released from the node ND2 to the node ND1. In this case, the doping region 144, the well 122, the doping regions 132 and 152 constitute a SCR. The SCR is serially connected to the pnp transistor constituted by the doping region 131, the well 121 and the doping region 141.

Figure 4:
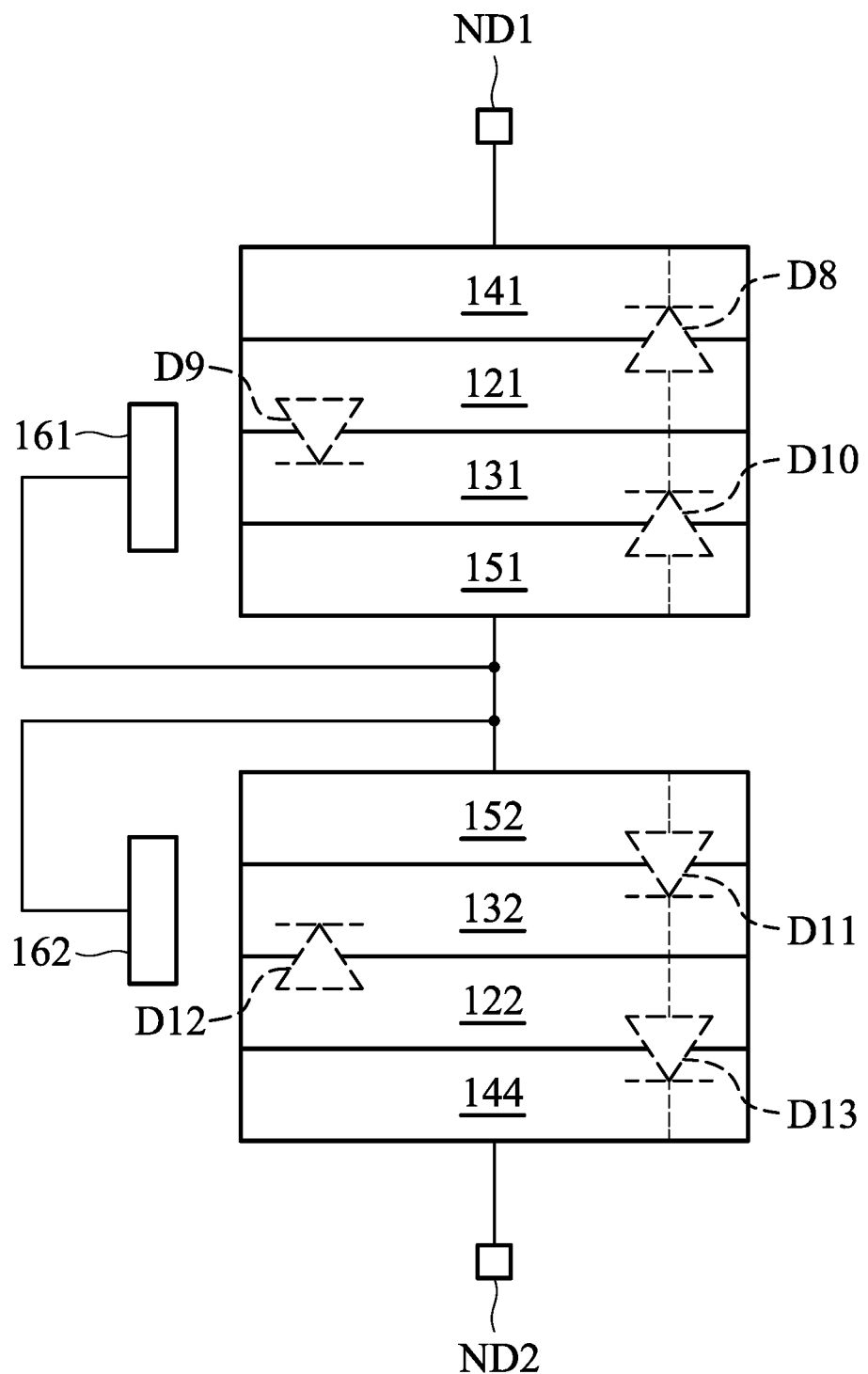
FIG. 4 is another equivalent circuit of the ESD protection device according to embodiments of the present invention.

FIG. 4 is another equivalent circuit of the ESD protection device according to an embodiment of the present invention. In this embodiment, assuming that the first conductive type is the P-type and the second conductive type is the N-type. When an ESD event occurs in the node ND1 and the node ND2 is coupled to ground, each of the equivalent diodes D8 and D10 are turned on in a reverse direction. Since the doping region 152 and the trigger gate 162 are electrically connected to the doping region 151, the equivalent diode D11 is turned on in a forward direction and the equivalent diode D12 is turned on in the the reverse direction. Therefore, the voltage level of the well 122 is increased such that the equivalent diode D13 is turned on in the forward direction. Since the equivalent diodes D8, D10, D11 and D13 are turned on, the ESD current is released from the node ND1 to the node ND2. In this case, the doping region 132, the well 122, and the doping region 144 constitute an npn transistor.

When an ESD event occurs in the node ND2 and the node ND1 is coupled to ground, each of the equivalent diodes D11 and D13 are turned on in the reverse direction. Since the doping region 152 is electrically connected to the doping region 151, the voltage level of the doping region 151 is increased such that the equivalent diode D10 is turned on in the forward direction. Furthermore, the voltage level of the trigger gate 161 is also increased such that the equivalent diode D9 is turned on in the reverse direction. When the equivalent diode D9 is turned on, the voltage level of the well 121 is increased such that the equivalent diode D8 is turned on in the forward direction. Since the equivalent diodes D13, D11, D10 and D8 are turned on, the ESD current is released from the node ND2 to the node ND1. In this case, the doping region 131, the well 121, and the doping region 141 constitute an npn transistor.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge protection device, comprising:
   a first well having a first conductive type;
   a first doping region having a second conductive type and formed in the first well;
   a second doping region having the second conductive type and formed in the first well;
   a third doping region having the first conductive type and formed in the second doping region;
   a fourth doping region having the second conductive type and formed in the second doping region;
   a first trigger gate formed on the first well and partially covering the second doping region;
   a second well having the first conductive type;
   a fifth doping region having the second conductive type and formed in the second well;
   a sixth doping region having the second conductive type and formed in the second well;
   a seventh doping region having the first conductive type and formed in the sixth doping region;
   an eighth doping region having the second conductive type and formed in the sixth doping region; and
   a second trigger gate formed on the second well and partially covering the sixth doping region, wherein the first conductive type is different from the second conductive type.

2. The electrostatic discharge protection device as claimed in claim 1, wherein the first and second trigger gates, the third, the fourth, the seventh, and the eighth doping regions are electrically connected to each other.

3. The electrostatic discharge protection device as claimed in claim 1, wherein the first conductive type is an N-type, and the second conductive type is a P-type.

4. The electrostatic discharge protection device as claimed in claim 1, wherein the first conductive type is a P-type, and the second conductive type is an N-type.

5. The electrostatic discharge protection device as claimed in claim 1, further comprising:
   a substrate having the second conductive type, wherein the first and second wells are formed in the substrate.

6. The electrostatic discharge protection device as claimed in claim 5, wherein the first well does not contact the second well.

7. The electrostatic discharge protection device as claimed in claim 1, further comprising:
   a first substrate having the second conductive type, wherein the first well is formed in the first substrate; and
   a second substrate having the second conductive type, wherein the second well is formed in the second substrate, which does not contact the first substrate.

8. The electrostatic discharge protection device as claimed in claim 1, wherein an impurity concentration of the first doping region is higher than an impurity concentration of the second doping region, and an impurity concentration of the third doping region is higher than an impurity concentration of the first well.

9. The electrostatic discharge protection device as claimed in claim 1, wherein an impurity concentration of the fifth doping region is higher than an impurity concentration of the sixth doping region, and an impurity concentration of the seventh doping region is higher than an impurity concentration of the second well.

10. The electrostatic discharge protection device as claimed in claim 1, wherein the first doping region, the first well and the second doping region constitute a first bipolar junction transistor (BJT), and the sixth doping region, the second well and the fifth doping region constitute a second BJT.

* * * * *